(12) United States Patent
Jeong et al.

(10) Patent No.: US 8,208,869 B2
(45) Date of Patent: Jun. 26, 2012

(54) MULTI-FUNCTION MONOLITHIC MICROWAVE INTEGRATED CIRCUIT (MMIC) OPERATING AS AMPLIFIER SWITCH

(75) Inventors: Jin Cheol Jeong, Daejeon (KR); In Bok Yom, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 80 days.

(21) Appl. No.: 12/897,882

(22) Filed: Oct. 5, 2010

(65) Prior Publication Data
US 2011/0234321 A1 Sep. 29, 2011

(30) Foreign Application Priority Data
Mar. 25, 2010 (KR) .................. 10-2010-0026740

(51) Int. Cl.
*H04B 1/44* (2006.01)
(52) U.S. Cl. .................. 455/78; 455/73; 455/84
(58) Field of Classification Search .......... 455/73, 455/78, 82, 83; 375/219; 330/295
See application file for complete search history.

(56) References Cited

U.S. PATENT DOCUMENTS

| | | | | |
|---|---|---|---|---|
| 4,635,062 A * | 1/1987 | Bierig et al. | .................. | 342/372 |
| 5,105,166 A * | 4/1992 | Tsukii et al. | .................. | 330/277 |
| 5,239,685 A * | 8/1993 | Moe et al. | .................. | 455/73 |
| 5,585,288 A * | 12/1996 | Davis et al. | .................. | 435/171 |
| 5,590,412 A * | 12/1996 | Sawai et al. | .................. | 455/82 |
| 5,669,068 A * | 9/1997 | Kielmeyer et al. | .................. | 455/83 |
| 5,705,940 A * | 1/1998 | Newman et al. | .................. | 326/68 |
| 5,890,056 A * | 3/1999 | Garner et al. | .................. | 455/67.11 |
| 2004/0048634 A1* | 3/2004 | Satoh et al. | .................. | 455/562.1 |
| 2004/0110476 A1 | 6/2004 | Filleboeck et al. | | |
| 2004/0198418 A1* | 10/2004 | Noda et al. | .................. | 455/550.1 |
| 2004/0235426 A1* | 11/2004 | Pozgay et al. | .................. | 455/73 |
| 2005/0153664 A1* | 7/2005 | Moloudi et al. | .................. | 455/78 |
| 2006/0135084 A1 | 6/2006 | Lee | | |

FOREIGN PATENT DOCUMENTS

| | | |
|---|---|---|
| KR | 2004-0016588 A | 2/2004 |
| KR | 2007-0028119 A | 3/2007 |

OTHER PUBLICATIONS

M. van Heijningen et al., "Multi Function and High Power Amplifier Chipset for X-Band Phased Array Frontends", Proceedings of the 1st European Microwave Integrated Circuits Conference, Sep. 2006, pp. 237-240.

D. Carosi et al., "A Mixed-Signal X-Band SiGe Multi-Function Control MMIC for Phased Array Radar Applications", Proceedings of the 39th European Microwave Conference, Oct. 2009, pp. 240-243.

* cited by examiner

*Primary Examiner* — Lewis West
(74) *Attorney, Agent, or Firm* — Rabin & Berdo, P.C.

(57) ABSTRACT

A multi-function MMIC operated by a switch using an amplifier is disclosed. A switch may be configured by connecting an input or an output of a plurality of amplifiers, and an insertion loss may be reduced by selecting a transmission mode or a reception mode of an MMIC using the switch. A noise characteristic, a power characteristic, and a gain characteristic may also be improved.

12 Claims, 4 Drawing Sheets

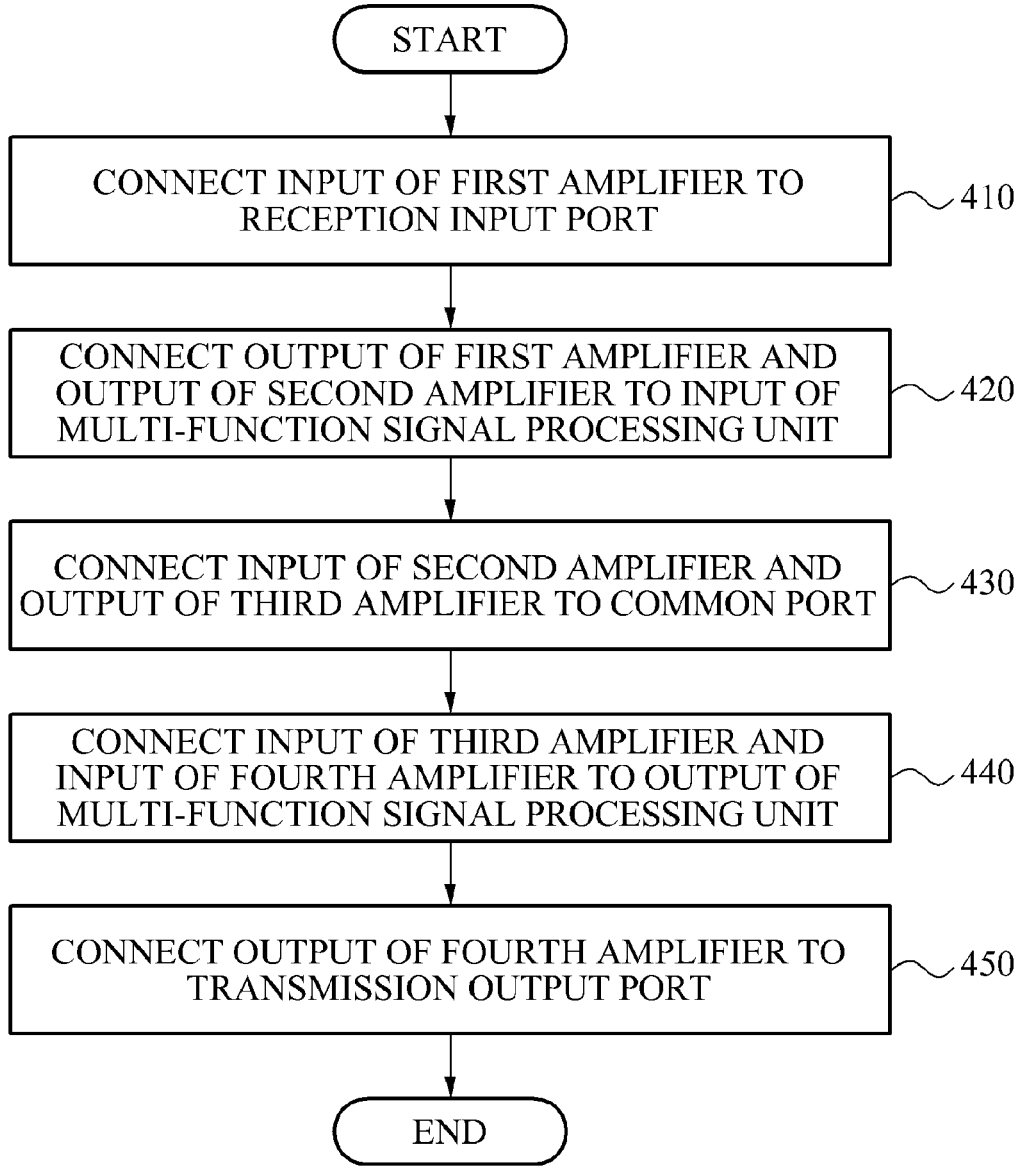

MULTI-FUNCTION MONOLITHIC MICROWAVE INTEGRATED CIRCUIT (MMIC) OPERATING AS AMPLIFIER SWITCH

CROSS-REFERENCE TO RELATED APPLICATION

This application claims the benefit of Korean Patent Application No. 10-2010-0026740, filed on Mar. 25, 2010, in the Korean Intellectual Property Office, the disclosure of which is incorporated herein by reference.

BACKGROUND

1. Field of the Invention

The present invention relates to a multi-function Monolithic Microwave Integrated Circuit (MMIC).

2. Description of the Related Art

A multi-function Monolithic Microwave Integrated Circuit (MMIC) is a core part used for a transmitter/receiver (T/R) module for a phase arrangement radar system, and has functions such as determination of one of a transmission mode and a reception mode, shifting a digital phase, and digital attenuation. The multi-function MMIC operates a power amplifier of a T/R module in a transmission mode, and locates a following end of a low-noise amplifier (LNA) of the T/R module to amplify a signal in a reception mode. Therefore, the multi-function MMIC requires a high-power characteristic and a low-noise characteristic.

A Single Pole Double Throw (SPDT) passive switch is used in the multi-function MMIC and the switch determines one of a reception mode and a transmission mode. However, a SPDT passive switch has a signal loss characteristic generally of about −3 to −2 dB. A SPDT passive switch is located at an input and an output of the multi-function MMIC, eventually lowering signal gain of the multi-function MMIC by about −6 to −4 dB.

SUMMARY

An aspect of the present invention provides a multi-function Monolithic Microwave Integrated Circuit (MMIC) that may operate according to a switch using an amplifier.

According to an aspect of the present invention, there is provided a multi-function high-frequency MMIC, including: a common port, a reception input port, and a transmission output port; a switch connected to the common port, the reception input port, and the transmission output port, and including a plurality of amplifiers; and a multi-function signal processing unit to process and output a signal inputted via the switch. The switch may select one of a reception mode and a transmission mode using the plurality of amplifiers. The reception input port, the multi-function signal processing unit, and the common port may be connected in series in the reception mode. The common port, the multi-function signal processing unit, and the transmission output port may be connected in series in the transmission mode.

The switch may include a first amplifier, a second amplifier, a third amplifier, and a fourth amplifier. An input of the first amplifier may be connected to the reception input port, an output of the first amplifier and an output of the second amplifier may be connected to an input of the multi-function signal processing unit, an input of the second amplifier and an output of the third amplifier may be connected to the common port, an input of the third amplifier and an input of the fourth amplifier may be connected to an output of the multi-function signal processing unit, and an output of the fourth amplifier may be connected to the transmission output port.

The first amplifier and the second amplifier may be low-noise amplifiers (LNAs), and the third amplifier and the fourth amplifier may be driving amplifiers (DRAs).

In the transmission mode, the first amplifier and the third amplifier may be in an off state corresponding to a deactivation state, and the second amplifier and the fourth amplifier may be in an on state corresponding to an activation state, thereby connecting the common port and the transmission output port to each other.

In the reception mode, the second amplifier and the fourth amplifier may be in an off state corresponding to a deactivation state, and the first amplifier and the third amplifier may be in an on state corresponding to an activation state, thereby connecting the reception input port and the common port to each other.

The switch may select one of the transmission mode and the reception mode based on a transmission/reception mode control signal.

The multi-function signal processing unit may include at least one of a low-noise amplifier, a driving amplifier, a digital phase shifter, and a digital attenuator.

Each of the plurality of amplifiers may include a cascoded common emitter hetero-junction bipolar transistor (HBT) and a common base HBT. Whether to operate the common base HBT may be controlled based on the transmission/reception mode control signal inputted to a base bias of the common base HBT.

Each of the plurality of amplifiers may further include an input matching unit connected between each of the inputs of the amplifiers and the base of the common emitter HBT to perform an impedance matching for each of the inputs, and an output matching unit connected between each of the outputs of the amplifiers and a collector of the common base HBT to perform an impedance matching for each of the outputs.

Each of the plurality of amplifiers may further include a bias circuit unit connected between the transmission/reception mode control signal and the base of the common base HBT to convert the transmission/reception mode control signal to a base voltage enabling the common base HBT to operate.

According to another aspect of the present invention, there is provided a method of configuring a multi-function high-frequency MMIC, the method including: connecting an input of a first amplifier to a reception input port; connecting an output of the first amplifier and an output of a second amplifier to an input of a multi-function signal processing unit which processes and outputs an inputted signal; connecting an input of the second amplifier and an output of a third amplifier to a common port; connecting an input of the third amplifier and an input of the fourth amplifier to an output of the multi-function signal processing unit; and connecting an output of the fourth amplifier to a transmission output port.

One of a reception mode and a transmission mode may be selected based on whether the plurality amplifiers are activated. The reception input port, the multi-function signal processing unit, and the common port may be connected in series in the reception mode. The common port, the multi-function signal processing unit, and the transmission output port may be connected in series in the transmission mode.

According to embodiments of the present invention, a switch may be configured by connecting an input or an output of a plurality of amplifiers, and an insertion loss may be reduced by selecting one of a transmission mode and a reception mode of a MMIC using the switch. A noise characteristic, a power characteristic, and a gain characteristic may also be improved.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which:

FIG. 4 is a flowchart illustrating a method of configuring a multi-function MMIC including a switch using an amplifier according to an embodiment of the present invention.

DETAILED DESCRIPTION

Figure 1:
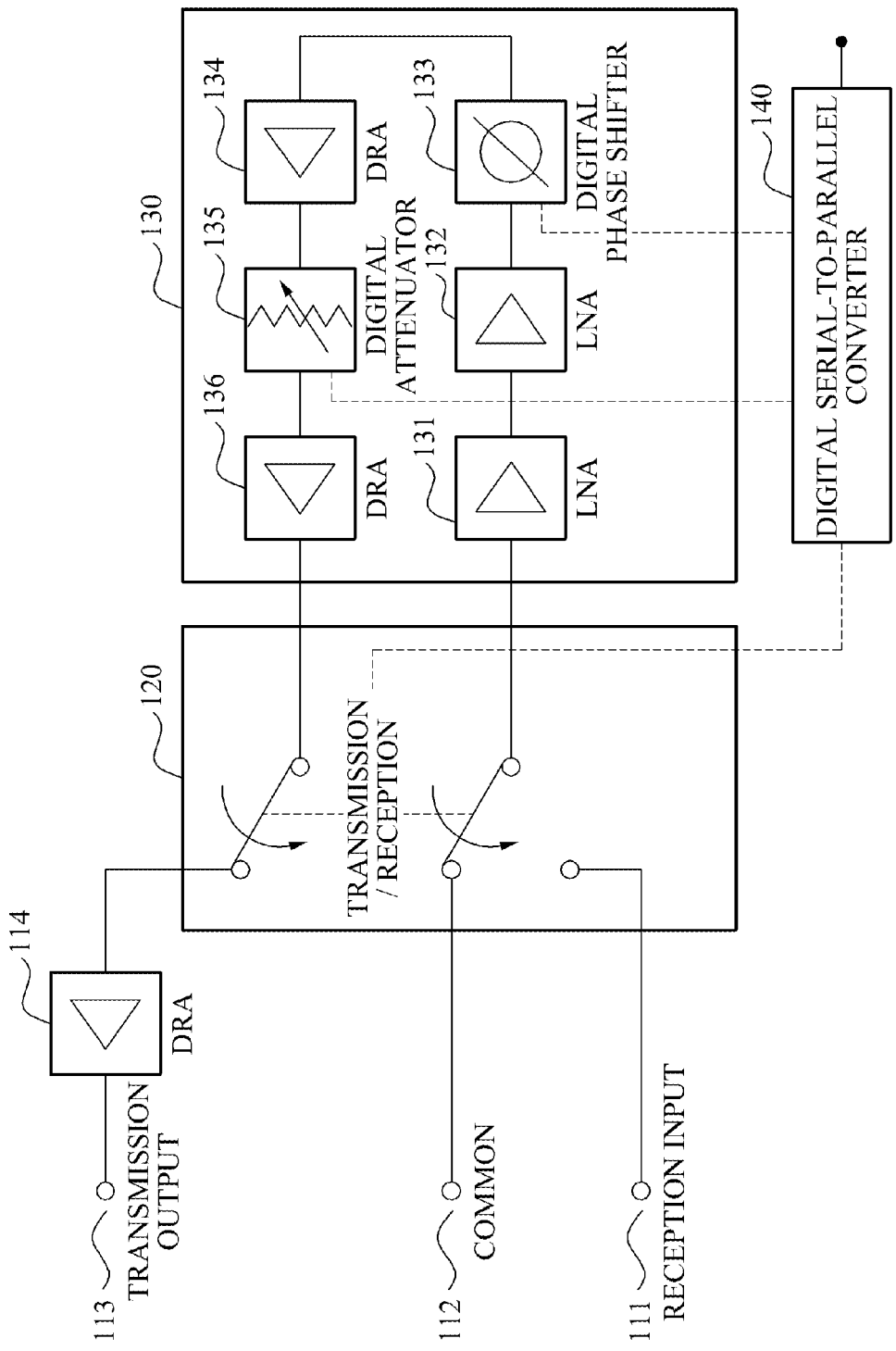
FIG. 1 is a diagram illustrating a multi-function Monolithic Microwave Integrated Circuit (MMIC) using a Single Pole Double Throw (SPDT) switch according to a related art.

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

When it is determined detailed description related to a related known function or configuration that may make the purpose of the present invention unnecessarily ambiguous in describing the present invention, the detailed description will be omitted here. Also, terms used herein are defined to appropriately describe the exemplary embodiments of the present invention and thus may be changed depending on a user, the intent of an operator, or a custom. Accordingly, the terms must be defined based on the following overall description of this specification.

FIG. 1 is a diagram illustrating a multi-function Monolithic Microwave Integrated Circuit (MMIC) using a Single Pole Double Throw (SPDT) switch according to a related art.

Referring to FIG. 1, the multi-function MMIC using the SPDT may include three radio frequency ports such as a common port 112, a reception input port 111, and a transmission output port 113. The multi-function MMIC using the SPDT may include a passive SPDT switch 120 to select one of a transmission mode and a reception mode.

The passive SPDT switch 120 may be connected to an input of a multi-function signal processing unit 130. The multi-function signal processing unit 130 may include the following configuration.

The multi-function signal processing unit 130 may include two Low Noise Amplifiers (LNA) 131 and 132 to improve a noise figure and to obtain a signal gain of the multi-function MMIC, a digital phase shifter 133 of 5 or 6 bits, and a Driving Amplifier (DRA) 134 to improve a power characteristic and to obtain a signal gain. Also, the multi-function signal processing unit 130 may include a digital attenuator 135 of 5 or 6 bits, and a DRA 136 to improve a power characteristic and to obtain a signal gain. An output of the multi-function signal processing unit 130 may be connected to a DRA 114 via the SPDT switch 120 to improve a power characteristic and to obtain a signal gain.

A transmission/reception mode control signal to select one of a transmission mode and a reception mode may be provided to the SPDT switch 120, the digital phase shifter 133, and the digital attenuator 135 via a digital serial-to-parallel converter 140.

In a reception mode, the SPDT switch 120 may be operated so that the reception input port 111 and an input of the LNA 131 may be connected to each other, and the common port 112 and an input of the LNA 131 may be disconnected from each other. Also, the SPDT switch 120 may be operated so that an output of the DRA 136 and the common port 112 may be connected to each other, and the output of the DRA 136 and an input of the DRA 114 of the transmission output port 113 may be disconnected from each other.

In a transmission mode, the SPDT switch 120 may be operated so that the reception input port 111 and an input of the LNA 131 may be disconnected from each other, and the common port 112 and an input of the LNA 131 may be connected to each other. Also, the SPDT switch 120 may be operated so that an output of the DRA 136 and the common port 112 may be disconnected from each other, and the output of the DRA 136 and an input of the DRA 114 of the transmission output port 113 may be connected with each other.

Figure 2:
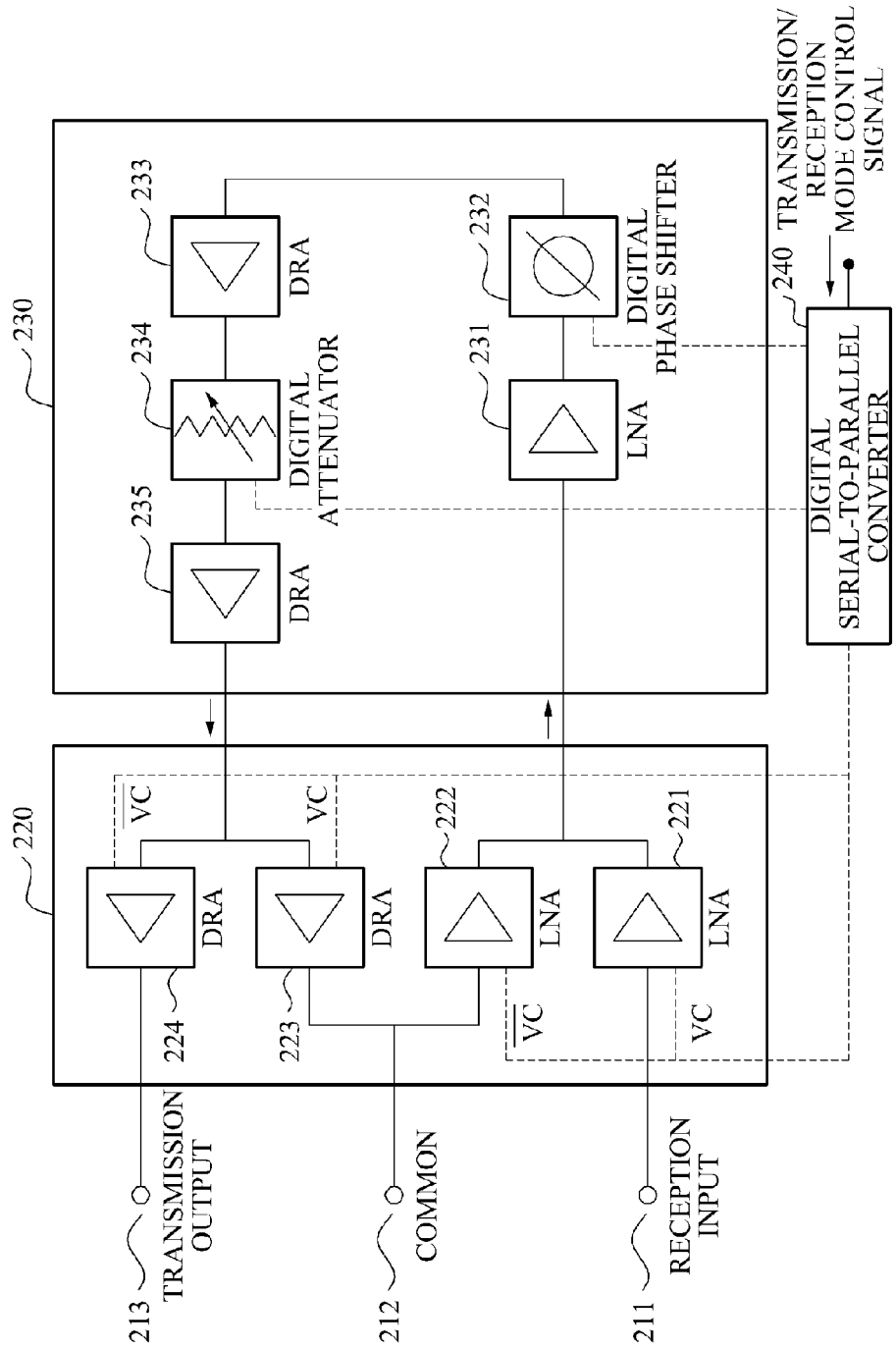
FIG. 2 is a diagram illustrating a multi-function MMIC including a switch using an amplifier according to an embodiment of the present invention.

FIG. 2 is a diagram illustrating a multi-function MMIC including a switch using an amplifier according to an embodiment of the present invention.

Referring to FIG. 2, the multi-function MMIC including the switch using the amplifier may include a reception input port 211 to receive an outer signal, a common port 212 commonly used for both a signal transmission process and a signal reception process, and a transmission output port 213 to transmit a signal. The multi-function MMIC may also include a switch 220 that is connected to the reception input port 211, the common port 212, and the transmission output port 213, and that includes a plurality of amplifiers. Also, the multi-function MMIC may include a multi-function signal processing unit 230 to process and output a signal inputted via the switch 220.

The switch 220 may include the plurality of amplifiers, for example, a first amplifier 221, a second amplifier 222, a third amplifier 223, and a fourth amplifier 224, however, the number of amplifiers may vary depending on embodiments.

An input of the first amplifier 221 may be connected to the reception input port 211, and an output of the first amplifier 221 and an output of the second amplifier 222 may be connected to an input of the multi-function signal processing unit 230. An input of the second amplifier 222 and an output of the third amplifier 223 may be connected to the common port 212, and an input of the third amplifier 223 and an input of the fourth amplifier 224 may be connected to an output of the multi-function signal processing unit 230. Also, an output of the fourth amplifier 224 may be connected to the transmission output port 213.

Here, the first amplifier 221 and the second amplifier 222 may be LNAs. An "LNA" indicates an amplifier that is designed by setting an operating point and a matching point so that the LNA may have a low noise figure. Generally, a noise factor of about 1.5 to 2.5 may be used. A power received by the reception input port 211 of a radio frequency may have a significantly low power level due to the influence of attenuation and noise. Therefore, amplification is needed, and an amplification function of minimizing noise may be used since the signal already contains a significant amount of noise from outside when being transmitted. Accordingly, the LNA may be used.

The third amplifier 223 and the fourth amplifier 224 may be DRAs. The DRA may be used for the following reason. A signal to be transmitted via an antenna at a transmitting end may need to be amplified with a relatively high power through a power amplifier. However, due to a structural characteristic of an amplifier, it may be difficult to obtain a high gain while obtaining a high power. Therefore, to operate the power amplifier, a DRA having a high gain may be used at a front end of the power amplifier to suitably amplify a power.

The switch 220 including the plurality of amplifiers may operate based on one of a transmission mode and a reception mode. The reception mode may be used for a signal reception process by connecting the reception input port 211, the multi-function signal processing unit 230, and the common port 212 in series. The transmission mode may be used for a signal transmission process by connecting the common port 212, the multi-function signal processing unit 230, and the transmission output port 213 in series.

Hereinafter, a connection relationship between amplifiers in each of the transmission mode and the reception mode will be described. In the reception mode, a voltage may be applied so that the second amplifier 222 and the fourth amplifier 224 may be in an off state corresponding to a deactivation state, and the voltage may be applied so that the first amplifier 221 and the third amplifier 223 may be in an on state corresponding to an activation state. Thus, in the reception mode, the switch 200 may connect an input of the multi-function signal processing unit 230 to the reception input port 211, and an output of the multi-function signal processing unit 230 to the common port 212.

In the transmission mode, a voltage may be applied so that the first amplifier 221 and the third amplifier 223 may be in an off state corresponding to a deactivation state, and the voltage may be applied so that the second amplifier 222 and the fourth amplifier 224 may be in an on state corresponding to an activation state. Thus, in a transmission mode, the switch 200 may connect an input of the multi-function signal processing unit 230 to the common port 212, and an output of the multi-function signal processing unit 230 to the transmission output port 213.

The transmission mode or the reception mode may be determined by a transmission/reception mode control signal. The transmission/reception mode control signal may be transferred to each of the first amplifier 221, the second amplifier 222, the third amplifier 223, and the fourth amplifier 224 in the switch 220 via the digital series-parallel converter 240, and whether to activate each of the first to fourth amplifiers may be controlled based on the transmission/reception mode control signal. The transmission/reception mode control signal may also be transferred to the digital phase shifter 232 and the digital attenuator 234.

A voltage applied to the transmission/mode control signal may be set to "5" V (transistor-transistor logic (TTL)) or "3.3" V (low voltage transistor-transistor logic (LVTTL)) when an amplifier is in an on state, and set to "0" V when an amplifier is in an off state. Generally, a TTL signal may be used for a gallium arsenide (GaAs) multi-function MMIC, and a LVTTL signal may be used for a Bipolar complementary metal-oxide-semiconductor (BiCMOS) multi-function MMIC.

The multi-function signal processing unit 230 may include an LNA 231 to improve a noise figure and to obtain a signal gain of the multi-function MMIC, a digital phase shifter 232 of 5 or 6 bits, and a DRA 233 to improve a power characteristic and to obtain a signal gain. The multi-function signal processing unit 230 may include a digital attenuator 234 of 5 or 6 bits to attenuate the magnitude of a signal, and a DRA 235 to improve a power characteristic and to obtain a signal gain. An output of the multi-function signal processing unit 230 may be connected to the switch 220 again. The multi-function signal processing unit 230 may process and output an inputted signal using various types of methods. Therefore, a configuration or a connection relationship of the multi-function signal processing unit 230 is not limited to the above, and may include embodiments modified freely by those skilled in the art.

Although the multi-function MMIC of FIG. 2 is provided with two additional amplifiers, for example, the second amplifier 222 and the third amplifier 223, compared to the multi-function MMIC of FIG. 1, two amplifiers may be in an on state and the remaining two amplifiers may be in an off state depending on whether the transmission mode or the reception mode is selected. Accordingly, even though the amplifiers are added, a power consumption may not increase.

In a reception mode, an increased gain may be obtained using the amplifier 223 additionally provided at an output end, that is, in front of the common port 212.

As described above, compared to a case where a SPDT passive switch connected to an input and an output is used, a multi-function MMIC including a switch using an amplifier according to an embodiment of the present invention may decrease a signal loss. A signal loss may deteriorate a noise characteristic and a power characteristic. Accordingly, the multi-function MMIC may obtain an improved noise characteristic and a power characteristic.

Figure 3:
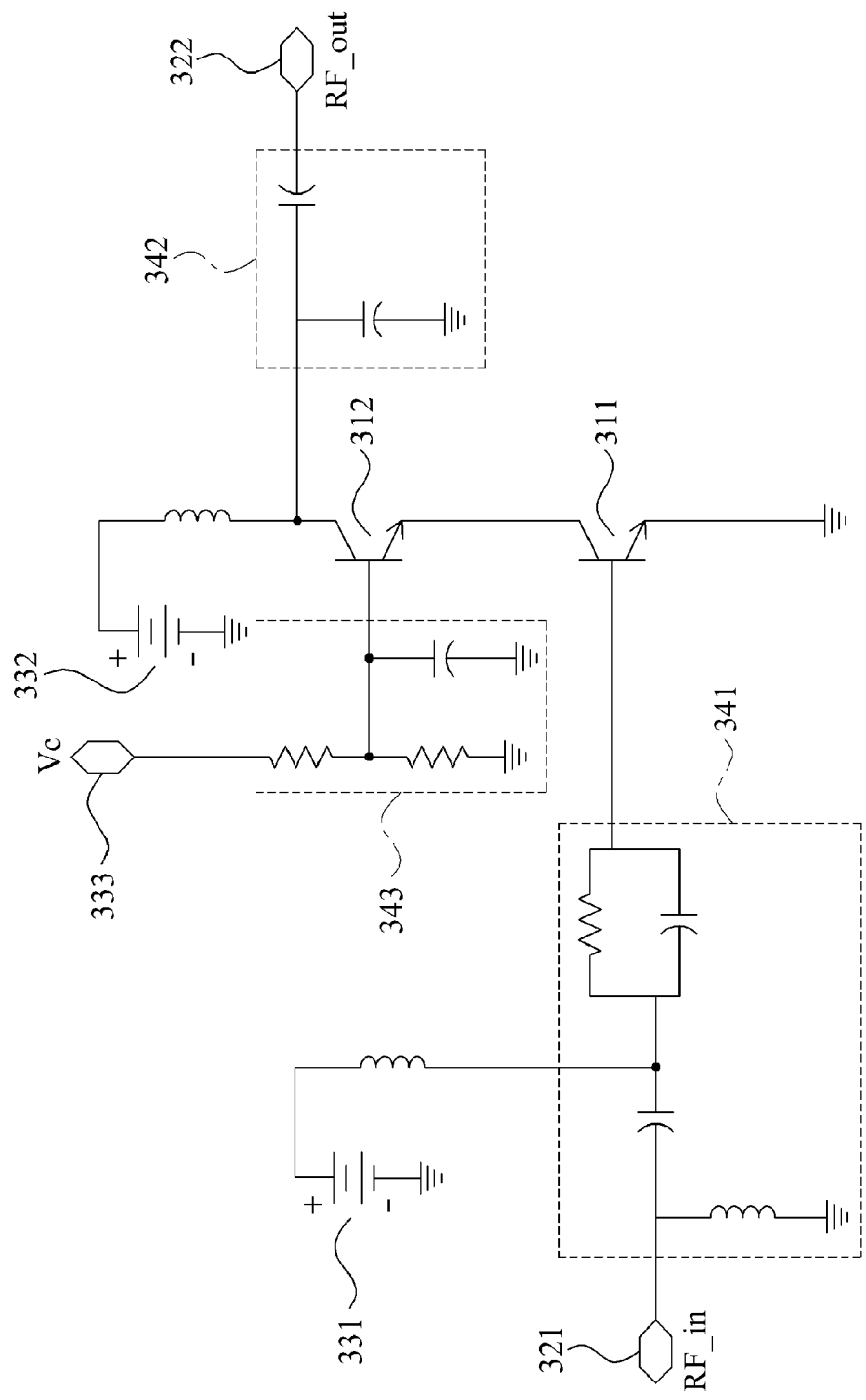
FIG. 3 is a diagram illustrating the amplifier used in the switch of FIG. 2.

FIG. 3 is a diagram illustrating the amplifier used in the switch illustrated in FIG. 2.

Referring to FIG. 3, the amplifier used for the switch may be a silicon-germanium hetero-junction bipolar transistor (SiGe HBT) amplifier using a BiCMOS process.

The amplifier may be a cascode amplifier, and may include a common emitter HBT 311 and a common base HBT 312. Here, an emitter of the common base HBT 312 is connected to a collector of a common emitter HBT 341. The amplifier may include an input port 321, an output port 322, an input matching unit 341, an output matching unit 342, and a bias circuit unit 343.

A base bias of the common emitter HBT 311 may be applied by a size-fixed voltage source 331, and a collector bias of the common base HBT 312 may be applied by a size-fixed voltage source 332.

A transmission/reception mode control signal 333 of the switch is inputted to a base of the common base HBT 312. Here, the transmission/reception mode control signal may be a TTL signal or a LVTTL signal. In the case of the LVTTL signal, the transmission/reception mode control signal may apply "3.3" V to a base of the common base HBT 312 when the corresponding amplifier is in an on state, or may apply "0" V to the base of the common HBT 312 when the corresponding amplifier is in an off state.

The bias circuit unit 343 may be connected between a transmission/reception mode control signal and a base of the common base HBT 312, to convert a transmission/reception mode control signal to a base voltage enabling the common base HBT 312 to operate.

The bias circuit unit 343 may convert a LVTTL signal ("3.3" V) which is a transmission/reception mode control signal to a suitable base voltage of the common base HBT 312. When the base voltage of the common base HBT 312 becomes "0" V, the common base HBT 312 may be deactivated, not operating as an amplifier, and when the base voltage of the common base HBT 312 becomes "3.3" V, that is, when an appropriate bias voltage is applied, the common base HBT 312 may be activated to properly operate as an amplifier.

The input matching unit 341 may be connected between an input of the amplifier and a base of the common emitter HBT 311 to perform an impedance matching for the input of the amplifier. The impedance matching may be performed by adjusting a base voltage of the common emitter HBT 311. Since an additional switch does not exist, the input matching unit 341 may reduce an insertion loss of a signal.

The output matching unit 342 may be connected between an output of the amplifier and a collector of the common base HBT 312 to perform an impedance matching for the output of the amplifier. The impedance matching may be performed by adjusting an output voltage of the amplifier. Since an additional switch does not exist, the output matching unit 342 may reduce an insertion loss of a signal.

FIG. 4 is a flowchart illustrating a method of configuring a multi-function MMIC including a switch using an amplifier according to an embodiment of the present invention.

Referring to FIG. 4, in operation 410, an input of a first amplifier may be connected to a reception input port of the MMIC.

In operation 420, an output of the first amplifier and an output of a second amplifier may be connected to an input of the multi-function signal processing unit which processes and outputs an inputted signal.

In operation 430, an input of the second amplifier and an output of a third amplifier may be connected to a common port of the MMIC.

In operation 440, an input of the third amplifier and an input of a fourth amplifier may be connected to an output of the multi-function signal processing unit.

In operation 450, an output of the fourth amplifier may be connected to a transmission output port of the MMIC.

Here, the processing procedure of operations 410 through 450 may be changed freely.

One of a transmission mode and a reception mode may be selected based on whether the first to fourth amplifiers are activated. In the reception mode, the reception input port, the multi-function signal processing unit, and the common port may be connected in series, and in the transmission mode, the common port, the multi-function signal processing unit, and the transmission output port may be connected in series.

A method of configuring the multi-function MMIC including the switch using the amplifier has been described. Various exemplary embodiments referring to FIG. 1 to FIG. 3 may be applied to the multi-function MMIC including the switch using the amplifier and thus, further detailed descriptions are omitted.

The above-described exemplary embodiments of the present invention may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments of the present invention, or vice versa.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A multi-function high-frequency Monolithic Microwave Integrated Circuit (MMIC), comprising:
a common port, a reception input port, and a transmission output port;
a switch connected to the common port, the reception input port, and the transmission output port, and comprising a plurality of amplifiers; and
a multi-function signal processing unit to process and output a signal inputted via the switch,
wherein the switch selects one of a reception mode and a transmission mode using the plurality of amplifiers,
the reception input port, the multi-function signal processing unit, and the common port are connected in series in the reception mode, and
the common port, the multi-function signal processing unit, and the transmission output port are connected in series in the transmission mode.

2. The multi-function high-frequency MMIC of claim 1, wherein:
the switch comprises a first amplifier, a second amplifier, a third amplifier, and a fourth amplifier, and
an input of the first amplifier is connected to the reception input port, an output of the first amplifier and an output of the second amplifier are connected to an input of the multi-function signal processing unit, an input of the second amplifier and an output of the third amplifier are connected to the common port, an input of the third amplifier and an input of the fourth amplifier are connected to an output of the multi-function signal processing unit, and an output of the fourth amplifier is connected to the transmission output port.

3. The multi-function high-frequency MMIC of claim 2, wherein the first amplifier and the second amplifier are low-noise amplifiers, and the third amplifier and the fourth amplifier are driving amplifiers.

4. The multi-function high-frequency MMIC of claim 2, wherein, in the transmission mode, the first amplifier and the third amplifier are in an off state corresponding to a deactivation state, and the second amplifier and the fourth amplifier are in an on state corresponding to an activation state, thereby connecting the common port and the transmission output port to each other.

5. The multi-function high-frequency MMIC of claim 2, wherein, in the reception mode, the second amplifier and the fourth amplifier are in an off state corresponding to a deactivation state, and the first amplifier and the third amplifier are in an on state corresponding to an activation state, thereby connecting the reception input port and the common port to each other.

6. The multi-function high-frequency MMIC of claim 1, wherein the switch selects one of the transmission mode and the reception mode based on a transmission/reception mode control signal.

7. The multi-function high-frequency MMIC of claim 1, wherein the multi-function signal processing unit comprises at least one of a low-noise amplifier, a driving amplifier, a digital phase shifter, and a digital attenuator.

8. The multi-function high-frequency MMIC of claim 1, wherein:
   each of the plurality of amplifiers comprises a cascoded common emitter hetero-junction bipolar transistor (HBT) and a common base HBT, and
   whether to operate the common base HBT is controlled based on the transmission/reception mode control signal inputted to a base bias of the common base HBT.

9. The multi-function high-frequency MMIC of claim 8, wherein each of the plurality of amplifiers further comprises:
   an input matching unit connected between each of the inputs of the amplifiers and the base of the common emitter HBT to perform an impedance matching for each of the inputs; and
   an output matching unit connected between each of the outputs of the amplifiers and a collector of the common base HBT to perform an impedance matching for each of the outputs.

10. The multi-function high-frequency MMIC of claim 8, wherein each of the plurality of amplifiers further comprises:
    a bias circuit unit connected between the transmission/reception mode control signal and the base of the common base HBT to convert the transmission/reception mode control signal to a base voltage enabling the common base HBT to operate.

11. A method of configuring a multi-function high-frequency MMIC, the method comprising:
    connecting an input of a first amplifier to a reception input port;
    connecting an output of the first amplifier and an output of a second amplifier to an input of a multi-function signal processing unit which processes and outputs an inputted signal;
    connecting an input of the second amplifier and an output of a third amplifier to a common port;
    connecting an input of the third amplifier and an input of the fourth amplifier to an output of the multi-function signal processing unit; and
    connecting an output of the fourth amplifier to a transmission output port.

12. The method of claim 11, wherein:
    one of a reception mode and a transmission mode is selected based on whether the plurality amplifiers are activated,
    the reception input port, the multi-function signal processing unit, and the common port are connected in series in the reception mode, and
    the common port, the multi-function signal processing unit, and the transmission output port are connected in series in the transmission mode.

* * * * *